United States Patent
Ifis et al.

(10) Patent No.: US 12,052,824 B2
(45) Date of Patent: Jul. 30, 2024

(54) COMPONENT CARRIERS CONNECTED BY STAGGERED INTERCONNECT ELEMENTS

(71) Applicant: AT&S Austria Technologie & Systemtechnik Aktiengesellschaft, Leoben (AT)

(72) Inventors: Abderrazzaq Ifis, Leoben (AT); Jens Riedler, Trofaiach (AT); Christopher Hermann, Velden am Wörthersee (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 25 days.

(21) Appl. No.: 17/650,361

(22) Filed: Feb. 8, 2022

(65) Prior Publication Data
US 2022/0256704 A1 Aug. 11, 2022

(30) Foreign Application Priority Data

Feb. 9, 2021 (EP) .................................... 21156051

(51) Int. Cl.
*H05K 1/14* (2006.01)
*H05K 1/03* (2006.01)
(Continued)

(52) U.S. Cl.
CPC ........... *H05K 1/144* (2013.01); *H05K 1/0306* (2013.01); *H05K 1/115* (2013.01); *H05K 3/4623* (2013.01)

(58) Field of Classification Search
CPC ......... H05K 1/144; H05K 2201/09709; H05K 2201/096; H05K 2201/095
See application file for complete search history.

(56) References Cited

U.S. PATENT DOCUMENTS 6,163,957 A 12/2000 Jiang et al.
6,558,780 B2 5/2003 Suzuki et al.
(Continued)

FOREIGN PATENT DOCUMENTS

DE 69622606 T2 1/1996
DE 19638195 A1 9/1996
(Continued)

OTHER PUBLICATIONS

Cortes Rosa, J.; Extended European Search Report in Application No. 21156051.1; pp. 1-10; dated Aug. 10, 2021; European Patent Office; 80298, Munich, Germany.

*Primary Examiner* — Timothy J Thompson
*Assistant Examiner* — John B Freal
(74) *Attorney, Agent, or Firm* — Robert A. Blaha; Smith Tempel Blaha LLC

(57) ABSTRACT

An electronic device includes a first component carrier having a first stack with at least one first electrically conductive layer structure and/or at least one first electrically insulating layer structure, a second component carrier having a second stack with at least one second electrically conductive layer structure and/or at least one second electrically insulating layer structure, and an intermediate structure including at least three staggered electrically conductive and coupled vertical interconnect elements in an at least partially dielectric sheet and being directly connected between the first component carrier and the second component carrier for electrically coupling the first component carrier with the second component carrier.

18 Claims, 5 Drawing Sheets

(51) Int. Cl.
 *H05K 1/11* (2006.01)
 *H05K 3/46* (2006.01)

(56) References Cited

U.S. PATENT DOCUMENTS

| | | |
|---|---|---|
| 6,638,607 B1 | 10/2003 | Curcio et al. |
| 6,799,369 B2 | 10/2004 | Ochi et al. |
| 6,855,892 B2 | 2/2005 | Komatsu et al. |
| 8,058,558 B2 | 11/2011 | Mok et al. |
| 8,222,534 B2 | 7/2012 | Park et al. |
| 8,446,736 B2 | 5/2013 | Kita et al. |
| 8,863,379 B2 | 10/2014 | Kumar et al. |
| 8,970,031 B2 * | 3/2015 | Rathburn ............... H01L 24/94 257/734 |
| 9,445,511 B2 | 9/2016 | Kanda |
| 9,545,017 B2 | 1/2017 | Hunrath et al. |
| 2004/0082100 A1 | 4/2004 | Tsukahara et al. |
| 2004/0184219 A1 * | 9/2004 | Otsuka ............... H01L 23/49805 257/E23.079 |
| 2008/0041619 A1 | 2/2008 | Lee et al. |
| 2009/0288293 A1 | 11/2009 | Lee et al. |
| 2012/0003844 A1 * | 1/2012 | Kumar ............... H05K 3/4623 29/841 |
| 2012/0325533 A1 | 12/2012 | Yoshimura |
| 2012/0327626 A1 | 12/2012 | Horiuchi et al. |
| 2014/0231126 A1 | 8/2014 | Hunrath et al. |
| 2014/0251658 A1 | 9/2014 | Lin et al. |
| 2016/0366762 A1 | 12/2016 | Lin et al. |

FOREIGN PATENT DOCUMENTS

| | | |
|---|---|---|
| DE | 19638195 A1 | 4/1998 |
| DE | 60126555 T2 | 11/2001 |
| DE | 69622606 T2 | 12/2002 |
| DE | 60126555 T2 | 11/2007 |
| EP | 2114579 A1 | 11/2009 |
| EP | 2564677 A1 | 3/2013 |
| EP | 2577724 A1 | 4/2013 |
| JP | 4742485 B2 | 8/2011 |
| KR | 1020170011016 A | 2/2017 |
| WO | 2006098406 A1 | 9/2006 |

* cited by examiner

COMPONENT CARRIERS CONNECTED BY STAGGERED INTERCONNECT ELEMENTS

CROSS-REFERENCE TO RELATED APPLICATIONS

The present application claims priority to European Patent Application No. 21156051.1 filed Feb. 9, 2021, the disclosure of which is incorporated herein by reference.

TECHNICAL FIELD

The disclosure relates to an electronic device and to a method of manufacturing an electronic device.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

SUMMARY

There may be a need efficiently establish a vertical electric connection between different component carriers.

In order to efficiently establish a vertical electric connection between different component carriers an electronic device and a method of manufacturing an electronic device according to the independent claims are provided.

According to an exemplary embodiment, an electronic device is provided which comprises a first component carrier comprising a first stack which comprises at least one first electrically conductive layer structure and/or at least one first electrically insulating layer structure, a second component carrier comprising a second stack which comprises at least one second electrically conductive layer structure and/or at least one second electrically insulating layer structure, and an intermediate structure comprising at least three staggered electrically conductive and coupled vertical interconnect elements in an at least partially (in particular completely) dielectric sheet and being directly connected between the first component carrier and the second component carrier for electrically coupling the first component carrier with the second component carrier.

According to another exemplary embodiment of the invention, a method of manufacturing an electronic device is provided, wherein the method comprises providing a first component carrier comprising a first stack which comprises at least one first electrically conductive layer structure and/or at least one first electrically insulating layer structure, providing a second component carrier comprising a second stack which comprises at least one second electrically conductive layer structure and/or at least one second electrically insulating layer structure, and directly connecting an intermediate structure, comprising at least three staggered electrically conductive vertical interconnect elements, between the first component carrier and the second component carrier for electrically coupling the first component carrier with the second component carrier by the vertical interconnect elements which may be embedded in an at least partially (in particular completely) dielectric sheet.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "intermediate structure" may particularly denote a layer-type or sheet-type body to be sandwiched between the first component carrier and the second component carrier for establishing a mechanical connection and a substantially vertical electrical connection between the component carriers. In particular, the intermediate structure may comprise an adhesive, sticky or gluing medium for creating a mechanical connection force between the component carriers. Moreover, the intermediate structure may comprise vertical interconnect elements configured for establishing an electric coupling between the component carriers in a basically vertical direction.

In the context of the present application, the term "vertical interconnect element" may particularly denote an electrically conductive structure which extends vertically for enabling a flow or propagation of electric signals between the first component carrier and the second component carrier substantially vertically through the vertical interconnect element. Rather than being flat and substantially horizontal such as pads, each vertical interconnect elements may have a pronounced vertical extension for electrically guiding or conducting electric signals between the component carriers in a substantially vertical manner. For instance, the vertical interconnect elements may be metal filled laser vias, metal filled mechanically drilled vias, metal pillars, or structures made of metallic paste.

In the context of the present application, the term "staggered" may particularly denote a spatial condition according to which stacked interconnected vertical interconnect elements are laterally displaced with respect to each other. In particular, central vertical axes of the different vertical interconnect elements may be shifted or offset relative to each other within the horizontal plane.

According to an exemplary embodiment of the invention, an electronic device composed of two component carriers with an intermediate structure in between may be provided, wherein three or more staggered vertical interconnect elements extending through the intermediate structure may establish an electric coupling between the first component carrier and the second component carrier. At the same time, the intermediate structure may connect the first component carrier with the second component carrier mechanically. By providing three or more stacked or staggered vertical interconnect elements as a substantially, but not exactly vertical electric through connection through the intermediate structure, even misaligned pads or other electrically conductive structures of the component carriers may be reliably connected along a short path. Said short path enables a low ohmic and high-quality transmission of electric signals propagating between the component carriers through the staggered vertical interconnect elements with low losses in terms of power and signal quality. By providing at least three staggered vertical interconnect elements, a first one may enable alignment with the first component carrier, a second one may enable alignment with the second component carrier, and a third one in between may connect the first one with the second one. Hence, registration issues may be overcome, and a high yield may be obtained. Furthermore, the described design of the intermediate structure may contribute to a continued miniaturization of the component carrier-based electronic device. Apart from this, the described manufacturing architecture avoids undesired delamination of the component carriers, suppresses any tendency of creation of defects such as voids in the interior of the electronic device, reduces the risk of breakage and limits stress caused by resin shrinkage during curing of a resin of the intermediate structure. Moreover, the connection of multiple component carriers by the intermediate structure with stacked and laterally displaced vertical interconnect elements may allow to construct module-type or system-type electronic devices providing even sophisticated electronic functions.

In the following, further exemplary embodiments of the electronic device and the method will be explained.

In an embodiment, the at least three staggered vertical interconnect elements are laterally displaced with respect to each other. This allows to compensate misalignment between exposed pads of the component carriers to be interconnected via the mutually displaced vertical interconnect elements of the intermediate structure.

In an embodiment, at least one of the at least three staggered vertical interconnect elements is a metal-filled via, in particular having tapering side walls (as in case of a laser via) or straight side walls (as in case of a mechanically drilled via). Such a via may be filled by plating (in particular by galvanic plating and/or electroless plating) so that a low ohmic dense metal filling may be obtained, for instance a filling with plated copper. Alternatively, such a via may be filled by applying and curing a metal paste in the via. It is also possible that one or more vertical interconnect elements in the middle of the staggered array have a substantially X-shaped cross-section, for instance in case of laser drilling from both sides.

In an embodiment, at least one of the at least three staggered vertical interconnect elements is a metal pillar. A pillar may be a post-like structure which may be formed in or assembled as an inlay into a hole formed in a dielectric sheet of the intermediate structure.

In an embodiment, the at least partially dielectric sheet of the intermediate structure comprises a central stiffener through which one of the vertical interconnect elements extends. In the context of the present application, the term "central stiffener" may in particular denote a central layer or sheet of the intermediate structure which has a locally increased stiffness as compared to surrounding material of the intermediate structure. Preferably, the central stiffener may be made of an electrically insulating material, such as a resin (in particular epoxy resin), optionally comprising reinforcing particles (such as glass particles, for instance glass spheres or glass fibers). For example, the central stiffener may be made of FR4 material. In an embodiment, the central stiffener is a fully cured core. A central stiffener may be advantageously implemented in a central portion of the intermediate structure to provide stability and to avoid curing-related shrinkage of an already initially cured central stiffener when interconnecting the intermediate structure with the component carriers. This may, in turn, avoid excessive stress resulting from the central stiffener during interconnection (for instance by compression bonding or by lamination) and may thereby efficiently prevent stress-based defects of the vertical interconnect elements.

In an embodiment, the at least partially dielectric sheet of the intermediate structure comprises a first connection layer on a first main surface of the stiffener connecting the intermediate structure with the first component carrier and through which one of the vertical interconnect elements extends. Preferably, such a first connection layer may be at least partially uncured before interconnection of the component carriers with the intermediate structure in between. In this context, "at least partially uncured" may in particular denote that the material of the connection layer may become flowable during lamination-based interconnection, may start cross-linking or polymerizing, and may then be resolidified in a cured state in which the cured connection layer mechanically connects the intermediate structure with the connected component carrier. For instance, the first connection layer may comprise a (preferably before interconnection still curable) resin or prepreg. Although such a curable resin or prepreg may shrink during curing and may thus apply some stress to adjacent vertical interconnect elements, the combination with the already initially uncured central stiffener may significantly limit shrinkage-caused stress and may nevertheless allow the connection layer to provide an adhesive force with the connected component carrier.

In an embodiment, the at least partially dielectric sheet of the intermediate structure comprises a second connection layer on a second main surface of the stiffener connecting the intermediate structure with the second component carrier and through which one of the vertical interconnect elements extends. Preferably, such a second connection layer may be at least partially uncured before interconnection of the component carriers with the intermediate structure in between. For instance, the second connection layer may comprise a (preferably before interconnection still curable) resin or prepreg. Although such a curable resin or prepreg may shrink during curing and may thus apply some stress to adjacent vertical interconnect elements the combination with the already initially uncured central stiffener may significantly limit shrinkage-caused stress.

In an embodiment, the stiffener has a thickness of less than 200 µm, in particular a thickness in a range from 30 µm to 100 µm. Hence, already a very thin core as central stiffener may be sufficient for providing high stability and for limiting shrinkage-caused stress. With such a thin stiffener, the electronic device may be kept highly compact and the signal propagation path may be kept short. However, the thickness may be related to the final build-up. Depending on how thick the individual stacks are, the thickness of the core may increase or decrease. Hence, the thickness of the stiffener may be related to the thickness of the final build-up, as the stiffener is also responsible for the mechanical stability of the whole stack.

In an embodiment, at least one of the first connection layer and the second connection layer is a prepreg layer which has a thickness of less than 100 µm, in particular a thickness in a range from 20 µm to 30 µm. Advantageously, less resin may provide more stability. Already a very thin resin or prepreg sheet as first or second connection layer may be sufficient for providing a high adhesion force between the intermediate structure and the component carriers. With such thin connection layers, a remaining risk of curing shrinkage-related defects may be kept acceptably small, the electronic device may be produced in a compact way and the signal propagation path may be kept short.

However, if pillars or photoimageable dielectrics (PID), are used, no stress-related shrinkage may occur, and the thickness of the connection layer may change (for a PID, for instance, the thickness may be significantly decreased). Thus, in case of pillars and PID, there is no need to limit the thickness, as there will be no flow or shrinkage.

In an embodiment, the stiffener comprises reinforcing (for instance glass) particles, in particular glass fibers. Reinforcing glass fibers or spheres may significantly contribute to the stiffness of the stiffener which may additionally comprise a (preferably already cured before connection with the component carriers) resin. In particular, a network of glass fibers may provide pronounced stiffness. At the same time, such a stiffener may comprise a resin so as to keep the CTE (coefficient of thermal expansion) mismatch with the resin material of the connection layers sufficiently small.

In an embodiment, at least one of the first connection layer and the second connection layer is free of reinforcing particles such as glass fibers or other kinds of glass particles. With a fiber-free configuration of the connection layers, they may be flexible and capable of balancing out warpage and unevenness of the adjacent component carriers. This may contribute to the flattening of the component carriers during interconnection.

In an embodiment, at least one of the first connection layer and the second connection layer comprises at least one of the group consisting of a pure resin (i.e., without reinforcing particles), a resin with reinforcing particles (for instance prepreg), and a photoimageable dielectric (PID). The mentioned resin may for instance be an epoxy resin. The mentioned reinforcing particles may be glass fibers or glass spheres. A photoimageable dielectric may be an electrically insulating material which can be patterned with electromagnetic radiation such as light, infrared radiation or ultraviolet radiation. For instance, photoimageable polyimide may be implemented for this purpose. Such a patterning of a PID may form a hole in the respective connection layer which may be filled with an electrically conductive material such as a metal for forming a respective vertical interconnect element. When using a photoimageable dielectric, it may be possible to create an opening in the PID and fill the opening, for instance with copper, by plating. Thereafter, an interconnection may be established by thermal compression bonding.

In an embodiment, at least one of the vertical interconnect elements comprises a cured metal paste. For instance, such a metal paste may comprise metallic particles (for instance made of silver, copper, etc.) and a curable matrix material or evaporable solvent which can be cured or removed during curing the metal paste.

In an embodiment, neighbored ones of the at least three vertical interconnect elements are separated from each other and electrically coupled with each other by a horizontally extending interconnect pad. While each of the vertical interconnect elements may have a significant extension in the vertical direction, a pad may be a substantially horizontal flat metallic spot. Each vertical interconnect element may have a larger aspect ratio (i.e., a ratio between vertical extension and diameter) than each of the pads. Descriptively speaking, the pronounced horizontal extension area of the pads may allow to compensate staggering offsets between individual vertical interconnect elements of the intermediate structure in the horizontal plane to ensure reliable coupling between the individual vertical interconnect elements.

In an embodiment, the first component carrier comprises—at its main surface facing the intermediate structure—a first connection pad connected with the vertical interconnect elements, and in particular connected with at least one of the at least one first electrically conductive layer structure. Additionally or alternatively, the second component carrier may comprise—at its main surface facing the intermediate structure—a second connection pad connected with the vertical interconnect elements, and in particular connected with at least one of the at least one second electrically conductive layer structure. Descriptively speaking, the pronounced horizontal extension area of the pads may allow to compensate misalignment or tolerances between the component carriers and the intermediate structure in the horizontal plane.

In an embodiment, the vertical interconnect elements compensate a lateral shift between the first connection pad and the second connection pad. By laterally displacing the various vertical interconnect elements relatively to each other within a horizontal plane, a certain lateral offset between the connection pads of the component carriers may be balanced out.

In an embodiment, at least one of the group consisting of the interconnect pads, the first connection pad, and the second connection pad has a lateral extension of less than 350 µm, in particular less than 250 µm. In view of the staggering arrangement of the vertical connection elements, the connection pads of the component carriers can be kept relatively small, smaller than in conventional approaches. Thus, the described manufacturing architecture and design of the electronic device allows miniaturization.

In an embodiment, at least one of the at least three staggered vertical interconnect elements has a diameter in a range from 30 µm to 200 µm, in particular in a range from 50 µm to 150 µm. Hence, also the diameters of the vertical interconnect elements can be designed to be very small, without compromising on the capability of the electronic device to balance out lateral misalignment. Consequently, a high reliability of the obtained electronic device can be combined with a compact configuration.

In an embodiment, a central one of the at least three staggered vertical interconnect elements is laterally arranged between an upper one of the at least three staggered vertical interconnect elements and a lower one of the at least three staggered vertical interconnect elements. Descriptively speaking, the staggered vertical interconnect elements may be arranged with a staircase-shape. Thus, a spatial misalignment between connection pads of the component carriers may be bridged successively by the vertical interconnect elements arranged in accordance with a staircase-shape. In particular, a central interconnect element may be spatially displaced with respect to a lower interconnect element along a certain horizontal direction, and the upper interconnect element may be spatially displaced with respect to the central interconnect element along the same horizontal direction. In other words, staggering of the vertically stacked interconnect elements may occur continuously, in a side view or cross-sectional view, from the left-hand side to the right-hand side or from the right-hand side to the left-hand side.

In an embodiment, the upper one and the lower one of the at least three staggered vertical interconnect elements are laterally displaced by at least 50 μm, in particular by at least 150 μm, in particular with respect to a central one of the vertical interconnect elements. This allows to compensate even significant lateral mismatch between the component carriers to be connected, while keeping the design compact.

In an embodiment, the intermediate structure is free of a redistribution structure such as a redistribution layer (RDL), in particular is free of horizontally extending traces. In other words, no fan-out structure may be integrated in the intermediate structure in the described embodiment. Thus, the intermediate structure may be provided with incremental vias (a particular three or more) rather than having a redistribution layer integrated in a core-type intermediate structure. Descriptively speaking, such an intermediate structure may compensate a lateral shift between connection pads of the component carriers but does not distribute or redistribute an electric signal within a horizontal plane. By providing only level alignment without redistribution of signals, such an intermediate structure can be manufactured in a simple way without fan out. This may be advantageous in terms of signal quality, since an electric signal has to propagate substantially vertically and therefore along a very short path.

In an embodiment, all of the at least three staggered vertical interconnect elements laterally overlap with each other, in particular all vertical interconnect elements may have a common overlapping range. More specifically, in a viewing direction perpendicular on the electronic device, an overlapping area shared between all three (or more) staggered vertical interconnect elements may exist. This design may ensure that the propagation direction of electric signals between the component carriers through the intermediate structure may be substantially vertical, regardless of the laterally displaced staggering for misalignment compensation in the horizontal plane. This keeps signal paths short, saves energy and ensures a high signal quality.

In an embodiment, the method comprises connecting at least part of the intermediate structure with at least one of the first component carrier and the second component carrier by thermal compression bonding. Thermal compression bonding may connect the component carriers with the intermediate structure in between by elevated temperature and pressure. For instance, this may be advantageous when copper pillars are used as vertical interconnect elements being directly connected with respective ones of the component carriers. A direct copper-copper bonding may be created by thermal compression bonding. Also, lamination is a possible connection method.

As an alternative to a connection by thermal compression bonding or lamination, it may also be possible to connect the component carriers with the intermediate structure in between by soldering, brazing, and/or by bonding material such as glue and/or an additive (for instance a spray adhesion promoter).

In an embodiment, the method comprises arranging at least part of the intermediate structure with a central stiffener, a first connection layer connected on a first main surface of the stiffener, and a second connection layer connected on a second main surface of the stiffener between the first component carrier and the second component carrier, and thereafter connecting the intermediate structure with the first component carrier and the second component carrier. Such an embodiment is shown in FIG. 11. This keeps the number of bodies to be handled for creating the electronic device small. In such a configuration, one of the staggered vertical interconnect elements may be already attached to and may protrude beyond the first component carrier, and another one of the staggered vertical interconnect elements may be already attached to and may protrude beyond the second component carrier. The intermediate structure may, before interconnection, comprise the central one of the staggered vertical interconnect elements which may be exposed by holes formed in the dielectric sheet of the intermediate structure. For interconnection, the protruding vertical interconnect elements may be inserted into the holes, and interconnection may be triggered.

In another embodiment, the method comprises arranging a central stiffener of the intermediate structure between the first component carrier—having a connected first connection layer of the intermediate structure at a main surface—and the second component carrier—having a connected second connection layer of the intermediate structure at a second main surface. Thereafter, the central stiffener may be connected with the first connection layer (at one main surface) and with the second connection layer (at the other main surface). Such an embodiment is shown in FIG. 4. This keeps the number of bodies to be handled for creating the electronic device small. In such a configuration, each of the (preferably still uncured) connection layers may be attached to a respective one of the component carriers prior to interconnection of the electronic device. In such an embodiment, each connection layer may contribute to a flattening of the assigned component carrier, which may show some warpage, bending or surface profile.

In still another embodiment, the method comprises arranging a central stiffener of the intermediate structure between the first component carrier and the second component carrier, arranging a separate (i.e., still unconnected and preferably uncured) first connection layer of the intermediate structure between the first component carrier and the central stiffener, arranging a separate (i.e. still unconnected and preferably uncured) second connection layer of the intermediate structure between the second component carrier and the central stiffener, and thereafter connecting the first component carrier with the first connection layer, the first connection layer with the central stiffener, the central stiffener with the second connection layer, and the second connection layer with the second component carrier. Such an embodiment is shown in FIG. 7. Each of the connection structures may already be provided with a through hole for accommodating a respective vertical interconnect element protruding from the corresponding component carrier during interconnection.

In an embodiment, a respective component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, a respective component carrier comprises a stack of at least one electrically insulating layer structure and at least one electrically conductive layer structure. For example, the component carrier may be a laminate of the mentioned electrically insulating layer structure(s)

and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, a respective component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, a respective component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the respective at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g., based on polyphenylenether (PPE), polyimide (PI), polyamide (PA), liquid-crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the respective at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one component can be surface mounted on and/or embedded in a respective component carrier and can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the respective component carrier and/or may be embedded in an interior thereof.

In an embodiment, the respective component carrier is a laminate-type component carrier. In such an embodiment, the component carrier is a compound of multiple layer structures which are stacked and connected together by applying a pressing force and/or heat.

After processing interior layer structures of the respective component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
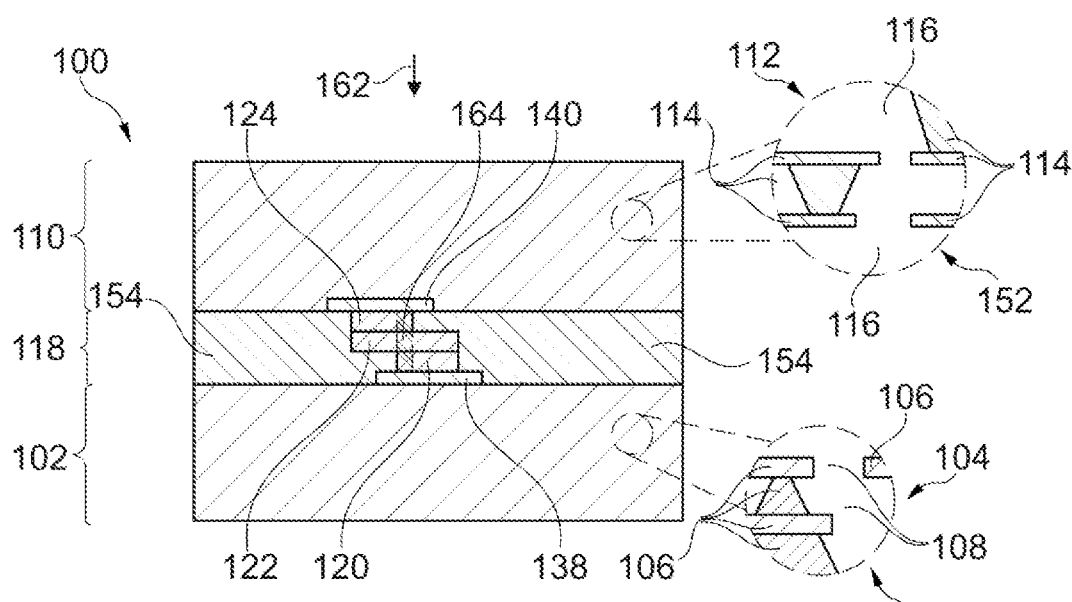
FIG. 1 illustrates a cross-sectional view of an electronic device according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

In conventional approaches of connecting two component carriers by an electrically conductive paste in a recess of a prepreg sheet, prepreg and paste are cured simultaneously. This however applies significant stress to the paste because of a pronounced shrinkage of the prepreg during curing. This high stress creates voids and defects in the paste and may result in product failure or breakage. Hence, the described conventional concept of creating a vertical interconnection may involve processability issues and alignment problems. In order to keep misalignment at an acceptable level, large pads need to be provided which contravenes to a desired miniaturization. A correspondingly manufactured electronic device may suffer from reliability limitations.

Thus, many conventional defects are related to the high resin amount flowing around the paste which may be a source of instability. More resin implies more shrinkage stress exerted to the metallic paste which may result in breakage, voids, and slipping. Furthermore, different scale values between the two component carriers may lead to high shear stress on the metallic paste interfaces, which may further increase the tendency of slipping and delamination. Such conventional approaches allow only a low miniaturization level as a corresponding manufacturing process setup cannot compensate the scaling mismatch between the component carriers to be connected. Thus, a big pad size of 500 µm and a minimum diameter of the metallic paste of 240 µm are consequences. The high amount of the metallic paste can also impact the electrical and thermal resistance compared to copper layers.

In view of the foregoing conventional shortcomings, it may be desired to improve metallic paste-based electronic devices for increasing reliability by eliminating slipping, delamination, metallic paste breakage and voids. Increasing the miniaturization level (in particular to achieve a smaller pad size and pitch) may be desired as well. Furthermore, it may be desired to decrease the yield loss due to scaling mismatch. Moreover, a reliability improvement may be desired. In particular, it may be desired to decrease the stress levels on the paste by lowering the amount of prepreg resin for obtaining a lower shrinkage and more stability. It may also be advantageous to add a stiffener in the bonding layer (for example fully cured FR4). Advantageously, the scaling mismatch between the component carriers to be connected may be at least partially compensated. It may be further desired to decrease the amount of the bonding paste used.

Miniaturization may be promoted by a decrease of the pad size by decreasing the metal paste via diameter from conventionally 200 µm to 70 µm to 100 µm. It may further be desired to compensate the scaling mismatch by an incremental approach (for instance implementing one or more intermediate layers).

According to an exemplary embodiment of the invention, a first component carrier and a second component carrier may be mechanically and electrically interconnected using an intermediate structure with a dielectric matrix and three or more stacked, staggered or laterally displaced vertical interconnect elements therein and/or thereon. Such a manufacturing architecture may reduce the amount of prepreg and thus the amount of stress acting on the electrically conductive vertical interconnect elements during curing of the prepreg. Less amount of prepreg means less stress and thus less artefacts and defects. In particular, the dielectric matrix of the intermediate structure may comprise a central stiffener (such as a fully cured core of FR4) which does not participate at curing and thereby does not experience shrinkage during establishing a connection between the component carriers. Apart from this, a core stiffener may increase the stability of the electronic device as a whole. Furthermore, the provision of three or more staggered vertical interconnect elements introduces additional degrees of freedom usable by a designer for reducing scaling mismatch and also reducing stress. The described manufacturing architecture also allows to reduce the amount of bonding paste needed and to increase the amount of dense copper, so that the electrical resistance of the vertical interconnect can be kept small. This results in a low loss of signal quality and electric energy during operation of the electronic device. Moreover, the diameter of an individual via may be reduced, for instance from conventionally 200 µm to a value in the range from 70 µm to 100 µm.

According to an exemplary embodiment of the invention, an electrically conductive vertical connection structure for electrically coupling two component carriers in a vertical direction may be provided which involves at least three staggered vertical interconnect elements in an intermediate structure between the component carriers. Such a manufacturing architecture increases the flexibility in terms of design, allows to obtain a high-frequency performance, supports a hybrid build-up and enables a high degree of miniaturization and modularization. At the same time, exemplary embodiments of the invention may overcome conventional limitations in terms of reliability issues resulting from a high amount of metal paste in a high amount of prepreg material causing excessive stress due to a pronounced curing shrinkage mismatch between prepreg (usually larger shrinkage) and metal paste (usually smaller shrinkage). In particular, exemplary embodiments of the invention provide a manufacturing concept which is executable on industrial scale, enables a high design flexibility, allows miniaturization and improved registration and involves only a small effort. By introducing an intermediate core between the component carriers, a decrease of the aspect ratio, a compensation of mismatching scale values and a reduction of the amount of electrically conductive paste and prepreg needed may be achieved. Such an intermediate core may provide additional stability and reliability to the build-up.

In particular, an exemplary embodiment of the invention may use two thin prepreg layers between a central cured core together with three (or more) staggered vertical interconnect elements rather than a single thick prepreg layer traversed by high amount of metallic paste. This reduces the manufacturing effort while compensating scaling mismatch between the component carriers to be assembled. More specifically, introducing a core stiffener between two thin prepreg sheets may allow to increase stability and stiffness, may reduce the amount of metallic paste needed, and may make it possible to expose both sides of the core with different scale values to compensate mismatch. For example, the scale values for each side can be loaded for exposing files of the individual component carriers. For example, the two sides of the core can be connected by laser vias or by plated through holes depending on a desired miniaturization level. Metallic paste for each component carrier can be directly aligned on the related component carrier through the respective prepreg sheet (which may be at least partially transparent). Using such a manufacturing concept, the pads may be smaller than in conventional approaches. For high flexibility, the laser connection can be smaller to ensure the scaling mismatch compensation. In an embodiment, it is also possible to use a photoimageable dielectric (PID) instead of a prepreg sheet.

In an embodiment (and also referring to the preceding paragraph), the method comprises, before the connecting, storing position and dimension information concerning a connection pad of the first component carrier and a connection pad of the second component carrier, wherein each of the connection pads is to be connected to a respective one of the at least three staggered electrically conductive vertical interconnect elements, and using the stored information for forming at least one of the at least three staggered electrically conductive vertical interconnect elements. More specifically, the described embodiment may allow for an individualized panel production and for process automation. For example, the surfaces of the two stacks to be connected may be structured before assembling (for instance before combining the two stacks with a stiffener). Thereby, the location and the dimensions of the connection pads may be saved in a log-file, which may be used during the next process stage(s), for example during structuring the stiffener. By using the log-file, the manufacturing machine knows exactly where the connecting pad(s) of the stiffener should appear, and which dimension the pad should have. For example, the machine can access the log-file using a barcode, which can be found on each stack, for instance having a construction manual included. Highly advantageously, this enables to execute an individualized panel production.

Exemplary applications of exemplary embodiments of the invention are component carrier-based electronic devices with high layer count, electronic devices with hybrid build-up, thick boards, high-frequency boards (for example for 5G applications), boards with one or more embedded components, boards for aerospace applications, etc.

An electronic device according to an exemplary embodiment of the invention may increases the reliability and the miniaturization level without any impact on the dielectric thickness or build-up design. Advantageously, the manufacturing architecture according to an exemplary embodiment of the invention may allow incremental processing with the possibility to compensate scaling mismatches. Furthermore, it may be possible to split and/or reduce the amount of metallic paste to achieve more stability, more stiffness, lower resistance and lower effort. It may also be possible to reduce the resin amount which may also contribute to more stability, more stiffness, and a stable process. Exemplary embodiments of the invention are also compatible with smaller pads compared to conventional approaches, so that the pad dimensions can be reduced for example from 500 μm to below 250 μm. Also, a pitch reduction by for instance 50% may become possible.

Descriptively speaking, an intermediate structure according to an exemplary embodiment of the invention may break the dielectric in three parts and does not add any additional complexity to the main build-up. The effort in terms of metallic paste may be reduced, since a lower amount may be sufficient, and a higher yield value may be achieved.

Advantageously, prepreg has to fill only less areas according to an exemplary embodiment of the invention, and copper on the core may be thinner. Apart from this, more stability may be obtained during final curing and a proper thickness control may be achieved. For high copper thicknesses, thicker prepregs can be used, if desired. It is also possible that prepregs are substituted by resin sheets. A laser may be perfectly aligned to each component carrier. By reducing the amount of metal paste, a lower resistance, less effort, high stability and a simplified manufacturing process may become possible. Furthermore, exemplary embodiments of the invention may offer the possibility for low aspect ratios (for instance by using alternative filling processes). Beyond this, there is the possibility to scale the two sides of the core with different scale values to compensate the scaling mismatches between the opposing component carriers. Beyond this, there may be a high miniaturization level on the component carriers, for instance from 500 μm pad size conventionally to 250 μm or less according to exemplary embodiments of the invention. For instance, a 250 μm pad and a 70 μm laser via can compensate a maximum shift between the component carriers of 540 μm. Advantageously, a shift compensation can be done automatically in order to manufacture the stiffener by using log-files, as explained above.

In an embodiment, it is also possible to use a copper pillar instead of conductive paste. This may offer more reliability and less electrical resistance. Using copper pillars and die bonding process may provide more reliable interfaces. In an embodiment, a photoimageable dielectric (PID) may be used to plate the copper pillars.

Furthermore, it may be possible to implement a compression bonding process to assemble or press the component carriers to be connected.

FIG. 1 illustrates a cross-sectional view of an electronic device 100 according to an exemplary embodiment of the invention.

The three main constituents of the electronic device 100 are a first component carrier 102, a second component carrier 110, and an intermediate structure 118 being mechanically and electrically connected in between.

As shown in a detail 150 in FIG. 1, the first component carrier 102 comprises a first laminated layer stack 104 which comprises a plurality of first electrically conductive layer structures 106 and a plurality of first electrically insulating layer structures 108. In the illustrated embodiment, the first component carrier 102 is embodied as laminate-type plate-shaped component carrier, in particular as printed circuit board (PCB).

Now referring to a detail 152 in FIG. 1, the second component carrier 110 comprises a second laminated layer stack 112 which comprises a plurality of second electrically conductive layer structures 114 and a plurality of second electrically insulating layer structures 116. In the shown embodiment, the second component carrier 110 is embodied as further laminate-type plate-shaped component carrier, in particular as printed circuit board (PCB).

As already mentioned, the laminated layer stacks 104, 112 are composed of electrically conductive layer structures 106, 114 and electrically insulating layer structures 108, 116. For example, the electrically conductive layer structures 106, 114 may comprise patterned copper foils (and optionally one or more vertical through connections, for example copper filled laser vias). The electrically insulating layer structures 108, 116 may comprise a resin (such as epoxy resin), optionally comprising reinforcing particles therein (for instance glass fibers or glass spheres). For instance, the electrically insulating layer structures 108, 116 may be made of prepreg or FR4. The layer structures 106, 108 may be connected by lamination, i.e., the application of pressure and/or heat. Correspondingly, the layer structures 114, 116 may be connected by lamination, i.e., the application of pressure and/or heat.

As shown in FIG. 1 as well, sheet-shaped or plate-shaped intermediate structure 118 is connected between the first component carrier 102 and the second component carrier 110. The intermediate structure 118 comprises an electrically conductive portion and an electrically insulating portion. The electrically conductive portion comprises three electrically conductive and mutually coupled vertically stacked and horizontally displaced or staggered vertical interconnect elements 120, 122, 124. Thus, the (here exactly) three staggered vertical interconnect elements 120, 122, 124 are laterally displaced with respect to each other. In the illustrated embodiment, the vertical interconnect elements 120, 122, 124 are directly electrically conductively connected with each other. As shown, the lowermost vertical interconnect element 120 is electrically connected with an exposed connection pad 138 of the first component carrier 102. Moreover, the uppermost vertical interconnect element 124 is electrically connected with an exposed connection pad 140 of the second component carrier 110. The central vertical interconnect element 122 bridges the spatial displacement between the lowermost interconnect element 120 and the uppermost interconnect element 124 of the intermediate structure 118. Thus, the staggered interconnect elements 120, 122, 124 are directly electrically connected between the connection pad 138 of the first component carrier 102 and the connection pad 140 of the second component carrier 110 for electrically coupling the first component carrier 102 with the second component carrier 110. Consequently, an electric signal may propagate substantially vertically between the component carriers 102, 110 through the staggered interconnect elements 120, 122, 124.

For instance, one or more of the vertical interconnect elements 120, 122, 124 may comprise a cured metal paste, for instance a cured silver paste and/or a cured copper paste. However, at least one of the vertical interconnect elements 120, 124 may also be embodied as inlay-type metal pillar or metal-plated via.

Figure 4:
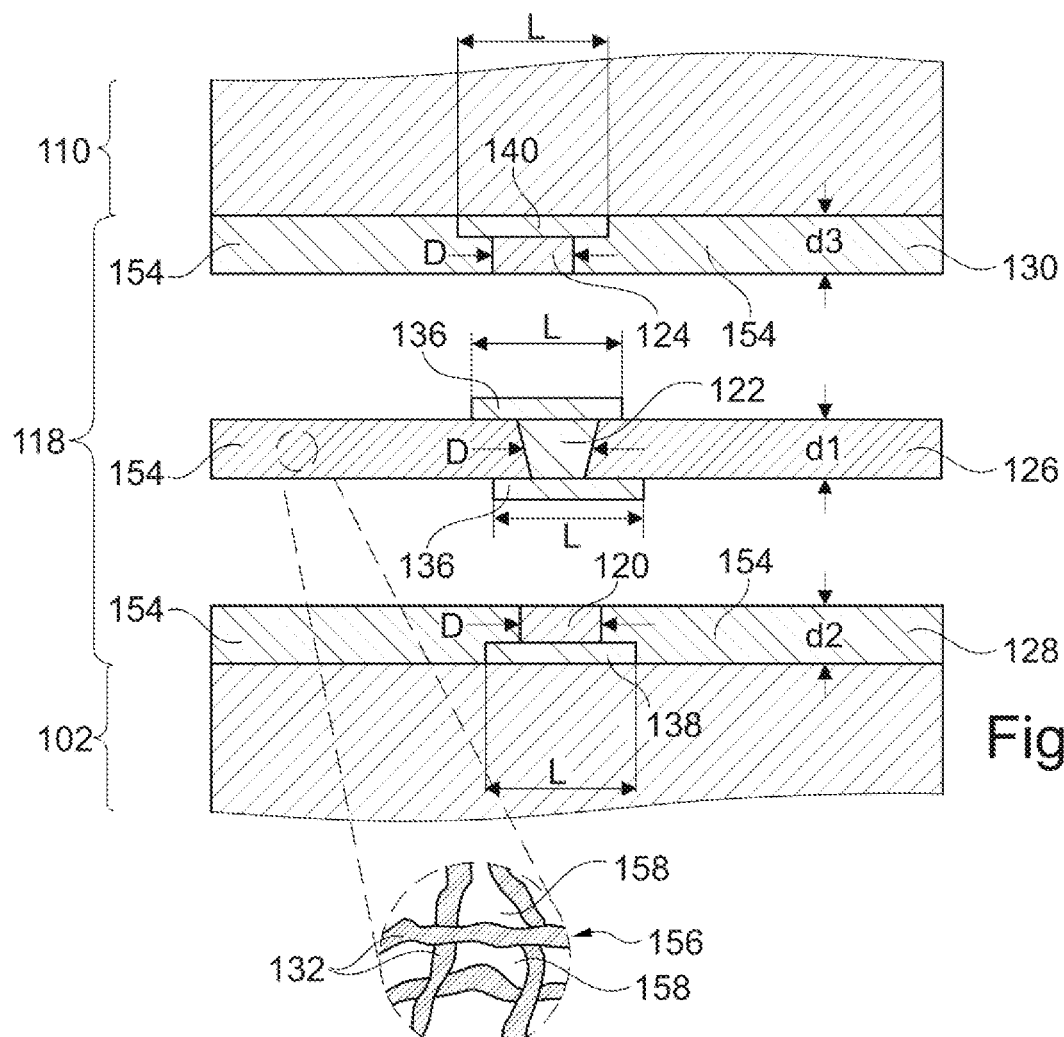
FIG. 4 shows a cross-sectional view of a structure obtained during carrying out a method of manufacturing an electronic device according to an exemplary embodiment of the invention.

As shown as well in FIG. 1, the three staggered vertical interconnect elements 120, 122, 124 are embedded in a dielectric sheet 154 of the intermediate structure 118. For instance, dielectric sheet 154 may be laminated on its top side and on its bottom side to the respective component carrier 102, 110. Thus, the intermediate structure 118 not only electrically couples the component carriers 102, 110, but also connects them mechanically. The dielectric sheet 154 may be made of a single homogeneous electrically insulating material, or may be made preferably of different electrically insulating materials, sub-sheets or layers (for instance as shown in FIG. 4).

Within the intermediate structure 118, an electric signal may propagate substantially vertically and thus along a short path. This keeps signal losses and energy losses small. Since the intermediate structure 118 is free of a redistribution structure, i.e., provides no electric fan-out function, the intermediate structure 118 may be constructed in a simple way and does not lengthen the signal propagation path. More specifically, the signal path between the connection pads 138, 140 does not extend along horizontal traces in the intermediate structure 118. In fact, intermediate structure 118 may be free of such horizontal traces. The short electric path through the intermediate structure 118 is promoted by the fact that the three laterally displaced, stacked and staggered vertical interconnect elements 120, 122, 124 laterally overlap with each other in a common overlapping range 164, in a viewing direction corresponding to the vertical direction according to FIG. 1, as indicated by reference sign 162.

Moreover, the staggering design of the interconnect elements 120, 122, 124 allows to compensate a lateral offset between the connection pads 138, 140 of the component carriers 102, 110 to be electrically coupled.

Figure 2:
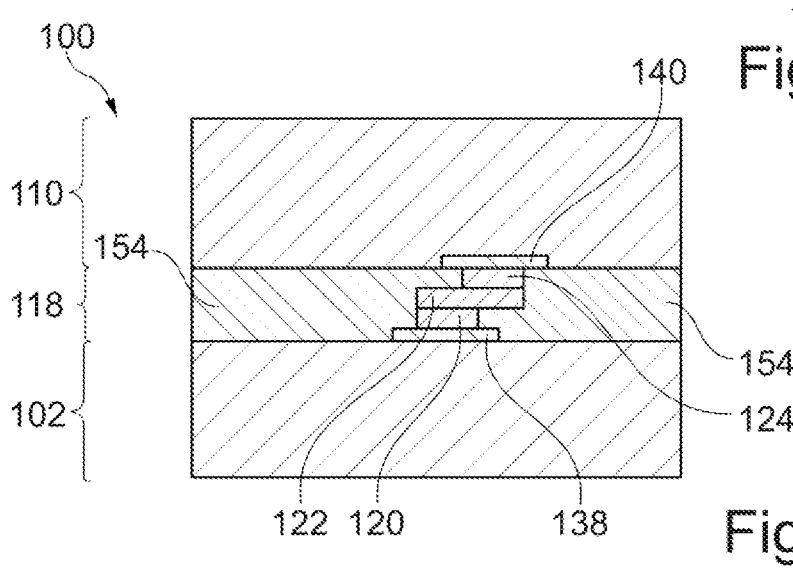
FIG. 2 illustrates a cross-sectional view of an electronic device according to another exemplary embodiment of the invention.

FIG. 2 illustrates a cross-sectional view of an electronic device 100 according to another exemplary embodiment of the invention.

The embodiment of FIG. 2 differs from the embodiment of FIG. 1 in that, in the embodiment according to FIG. 2, the staggering direction of the interconnect elements 120, 122, 124—from bottom to top—is from left to right rather than from right to left (as in FIG. 1). This demonstrates that the manufacturing architecture of embodiments of the invention can highly flexibly compensate any kind of offsets and misalignments between connection pads 138, 140 of the component carriers 102, 110, regardless of the direction of the offset or misalignment.

Figure 3:
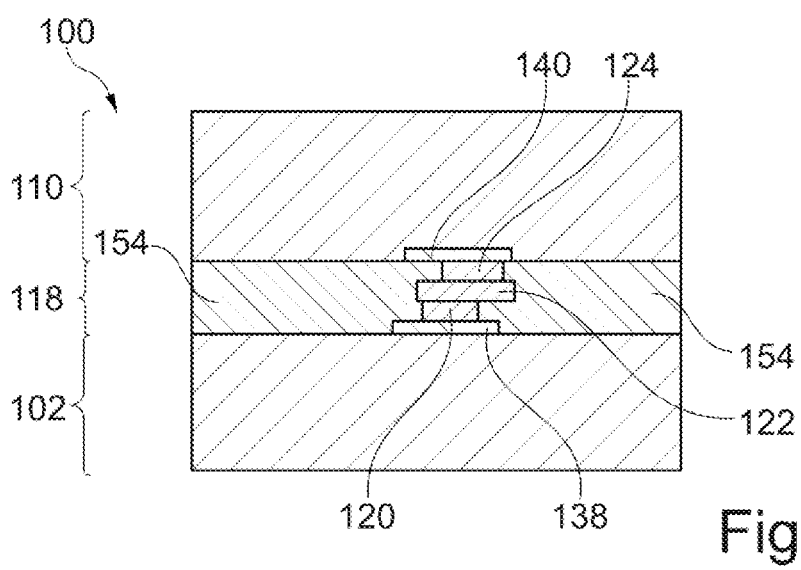
FIG. 3 illustrates a cross-sectional view of an electronic device according to still another exemplary embodiment of the invention.

FIG. 3 illustrates a cross-sectional view of an electronic device 100 according to still another exemplary embodiment of the invention.

The embodiment of FIG. 3 differs from the embodiment of FIG. 2 in that, in the embodiment according to FIG. 3, the amount of misalignment between the connection pads 138, 140 of the component carriers 102, 110 is smaller. This can be addressed by a horizontal positional adjustment of the interconnect elements 120, 122, 124 relatively to each other.

In each of the embodiments of FIG. 1 to FIG. 3, the central interconnect element 122 has a larger lateral (i.e., horizontal) extension than the lowermost interconnect element 120 and the uppermost interconnect element 124. This enables an extension of the spatial range of compensable misalignments between the connection pads 138, 140 of the component carriers 102, 110 without compromising on the compactness of the electronic device 100.

Figure 5:
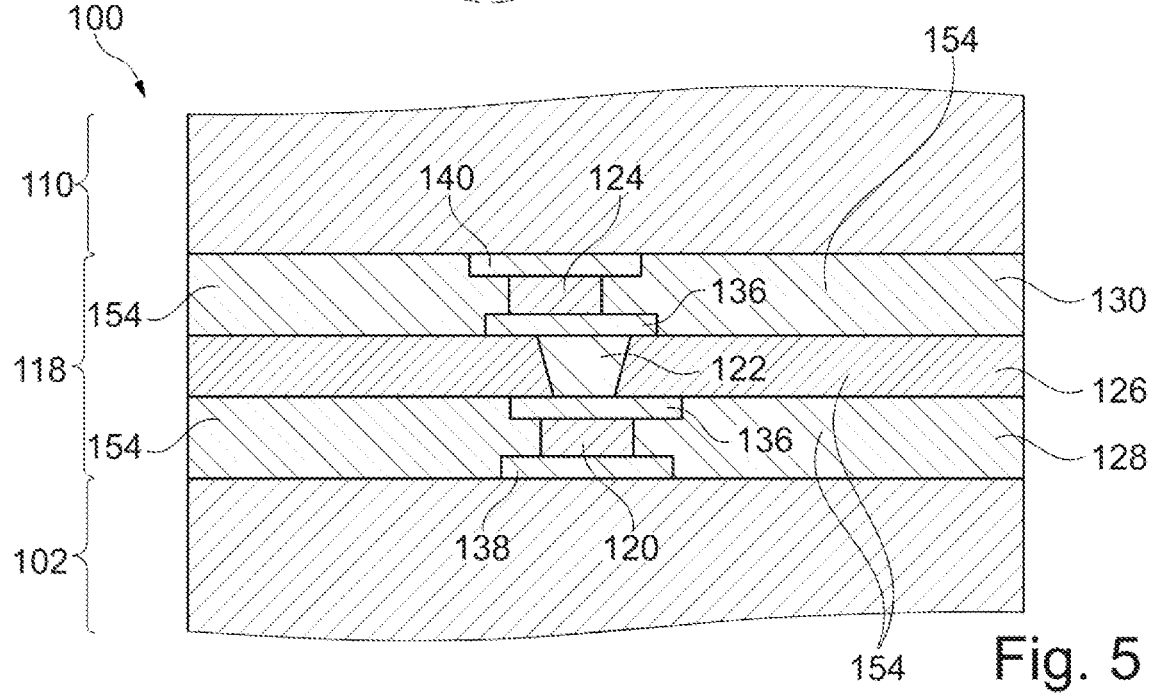
FIG. 5 shows a cross-sectional view of an electronic device according to an exemplary embodiment of the invention obtained by carrying out the method according to FIG. 4.

FIG. 4 shows a cross-sectional view of a structure obtained during carrying out a method of manufacturing an electronic device 100 according to an exemplary embodiment of the invention. FIG. 5 shows a cross-sectional view of an electronic device 100 according to an exemplary embodiment of the invention obtained by carrying out the method according to FIG. 4.

For manufacturing the electronic device 100, first component carrier 102 is provided, which can be embodied as described referring to FIG. 1. Moreover, second component carrier 110 is provided, which can be embodied as well as described referring to FIG. 1.

Furthermore, intermediate structure 118 having a central stiffener 126 is arranged vertically between the first component carrier 102 and the second component carrier 110. A through hole is formed in central stiffener 126 and is filled with central vertical interconnect element 122, such as a copper-plated or metal paste-filled laser via. A respective horizontally extending interconnect pad 136 is formed at each of the upper end and the lower end of central vertical interconnect element 122.

According to FIG. 4, a first connection layer 128 of the intermediate structure 118 is connected at a main surface of the first component carrier 102 at which connection pad 138 is located. The first connection layer 128 is patterned so as to have a through hole at which the connection pad 138 is exposed. In said through hole, lower vertical interconnect element 120 is accommodated so as to be electrically coupled to the connection pad 138.

Correspondingly, a second connection layer 130 of the intermediate structure 118 is connected at a main surface of the second component carrier 110 at which connection pad 140 is located. The second connection layer 130 is patterned so as to have a through hole at which the connection pad 140 is exposed. In this through hole, upper vertical interconnect element 124 is accommodated so as to be electrically coupled to the connection pad 140.

Thereafter, the central stiffener 126 of the intermediate structure 118 is connected with the first component carrier 102 (prepared as described) and the second component carrier 110 (prepared as described), for instance by thermal compression bonding. More specifically, this establishes a mechanical connection between the dielectric central stiffener 126 and the dielectric connection layers 128, 130. Simultaneously, this connection establishes an electrically conductive connection from the electrically conductive layer structures 106 of the first component carrier 102, via connection pad 138, via the lowermost vertical interconnect element 120, via the lower interconnect pad 136, via the central vertical interconnect element 122, via the upper interconnect pad 136, via the uppermost vertical interconnect element 124, up to connection pad 140, and from there to the electrically conductive layer structures 114 of the second component carrier 110.

For example, the central vertical interconnect element 122 is a metal-filled via, which may for instance be filled with plated metal or with a metal paste. The upper and the lower vertical interconnect elements 120, 124 may for instance be embodied as metal pillar.

As illustrated in a detail 156 of FIG. 4, the stiffener 126 may comprise a network of interconnected reinforcing particles 132, here embodied as glass fibers 132, in a matrix of resin 158 (for instance epoxy resin). For example, the stiffener 126 may be a fully cured core of FR4 material. However, the stiffener 126 may have a very low thickness d1 of for instance 40 μm to 50 μm. This is enough to sufficiently stiffen the electronic device 100 in its central region and may simultaneously keep the electronic device 100 compact. Furthermore, stiffener 126 may be already fully cured before connection, i.e., in the state of FIG. 4, so that dielectric material of the stiffener 126 does not experience a curing-related shrinkage during connection, which would introduce stress in the electronic device 100.

Each of the first connection layer 128 and the second connection layer 130 may be free of reinforcing glass particles and may for instance be a pure resin. Advantageously, each of the first connection layer 128 and the second connection layer 130 may have a very small thickness d2, d3, for instance in a range from 20 μm to 30 μm. The resin of the connection layers 128, 130 may be still uncured prior to the connection, i.e., in the state according to FIG. 4. Thus, the thermal compression bonding may trigger cross-linking or polymerization of the resin of the connection layers 128, 130 so that an adhesive connection can be formed between the connection layers 128, 130 and the material at both of their main surfaces. The resin of the connection layers 128, 130 may be cured at least partially during the connection. Due to their very small thickness d2, d3, the resin of the connection layers 128, 130 may experience curing-related shrinkage only to a small extent, so that the shrinkage-caused stress can remain acceptably small.

As in the previously described embodiments, the vertical interconnect elements 120, 122, 124 may compensate a lateral shift between the first connection pad 138 and the second connection pad 140. Each of the interconnect pads 136, the first connection pad 138, and the second connection pad 140 may have a relatively small lateral extension L of less than 250 μm. This promotes miniaturization and ensures at the same time misalignment compensation over a sufficiently large spatial range.

The upper one and the lower one of the three staggered vertical interconnect elements 120, 122, 124 are laterally displaced by a lateral distance (see "B" in FIG. 6) of preferably at least 200 μm. However, the three staggered vertical interconnect elements 120, 122, 124 may have a relatively small diameter D which is preferably in a range from 70 μm to 100 μm.

In the described embodiment, it may thus be possible to connect the flexible and curable resin or prepreg sheets in form of the connection layers 128, 130 to the component carriers 102, 110 prior to the interconnection (compare FIG. 4). This may be particularly preferred, since this contributes to a flattening of the printed circuit boards. As an alternative to pure resin or prepreg, ABF material may be used as well. As a further alternative, the connection layers 128, 130 may also be made of a photoimageable dielectric (PID).

The interconnect pads 136, 136 may compensate a different scaling on the front side and the back side of the stiffener 126. The connection layers 128, 130 may have a very small thickness d2, d3 of preferably 20 μm to 30 μm for miniaturization and to suppress stress-related defects. Also, the stiff core 120 may have a small thickness d1 of for example 40 μm to 50 μm to keep the electronic device 100 compact. Holes in the connection layers 128, 130 which serve for exposing the connection pads 138, 140 may be formed by laser drilling, mechanically drilling or etching and may be filled with metallic paste or another electrically conductive element such as a copper pillar.

Figure 6:
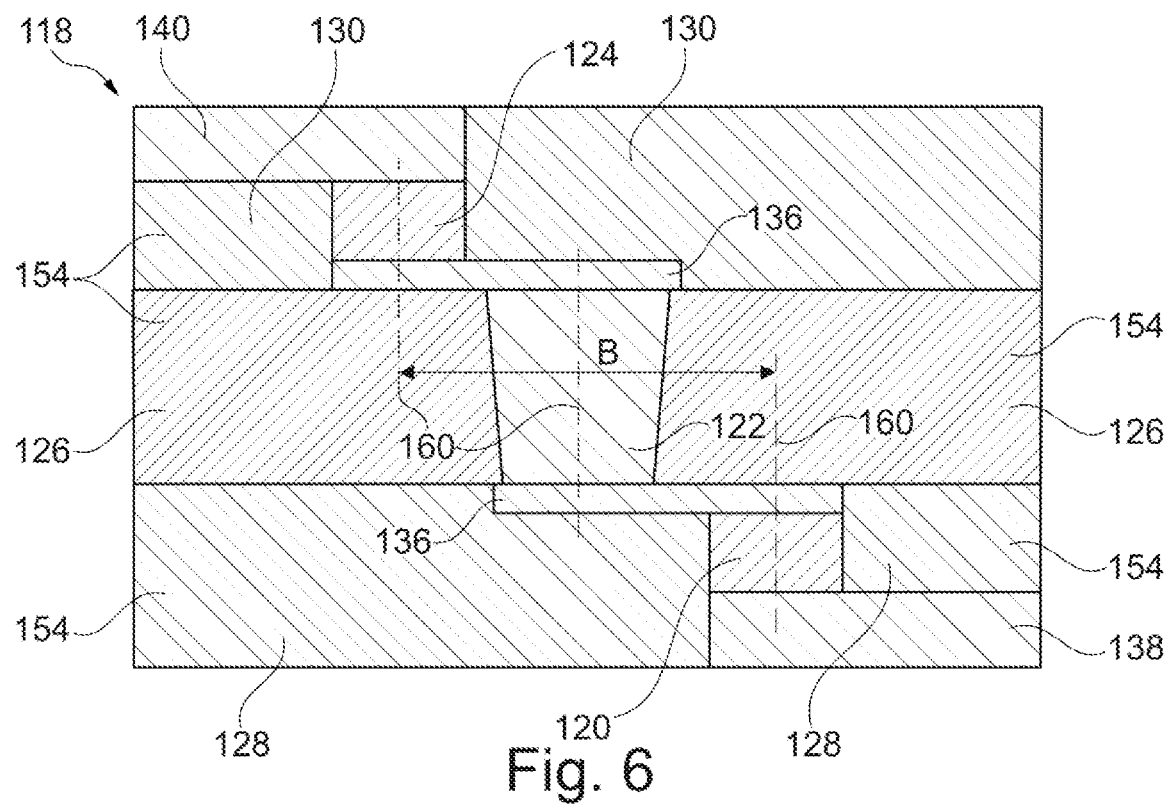
FIG. 6 shows a detailed view of an intermediate structure of an electronic device according to an exemplary embodiment of the invention.

FIG. 6 shows details of an intermediate structure 118 of an electronic device 100 according to an exemplary embodiment of the invention. As can be taken from FIG. 6, each of the interconnect elements 120, 122, 124 has a respective central axis 160 which is laterally displaced with respect to each other central axis 160 of each of the respectively other two vertical interconnect elements 120, 122, 124. By this configuration, even a large scaling mismatch can be compensated by the interconnect elements 120, 122, 124.

Figure 7:
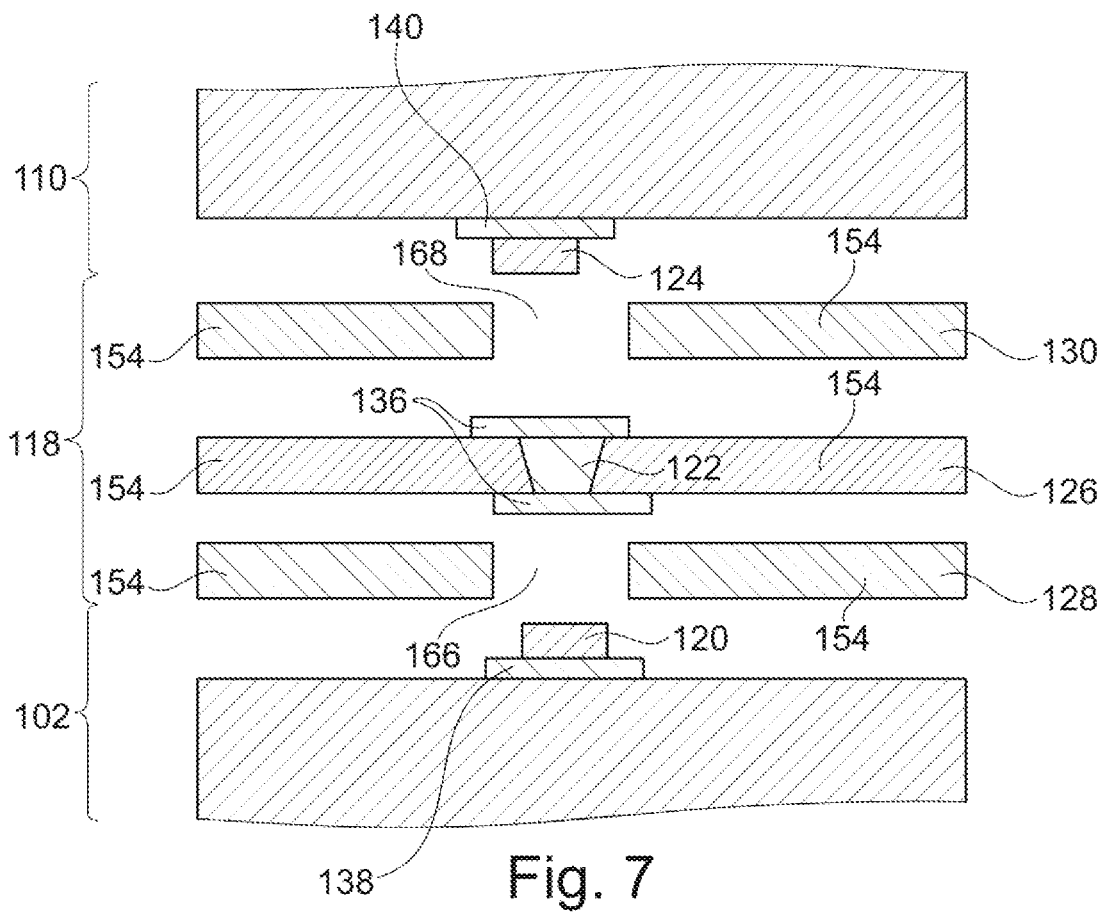
FIG. 7 shows a cross-sectional view of a structure obtained during carrying out a method of manufacturing an electronic device according to another exemplary embodiment of the invention.
Figure 8:
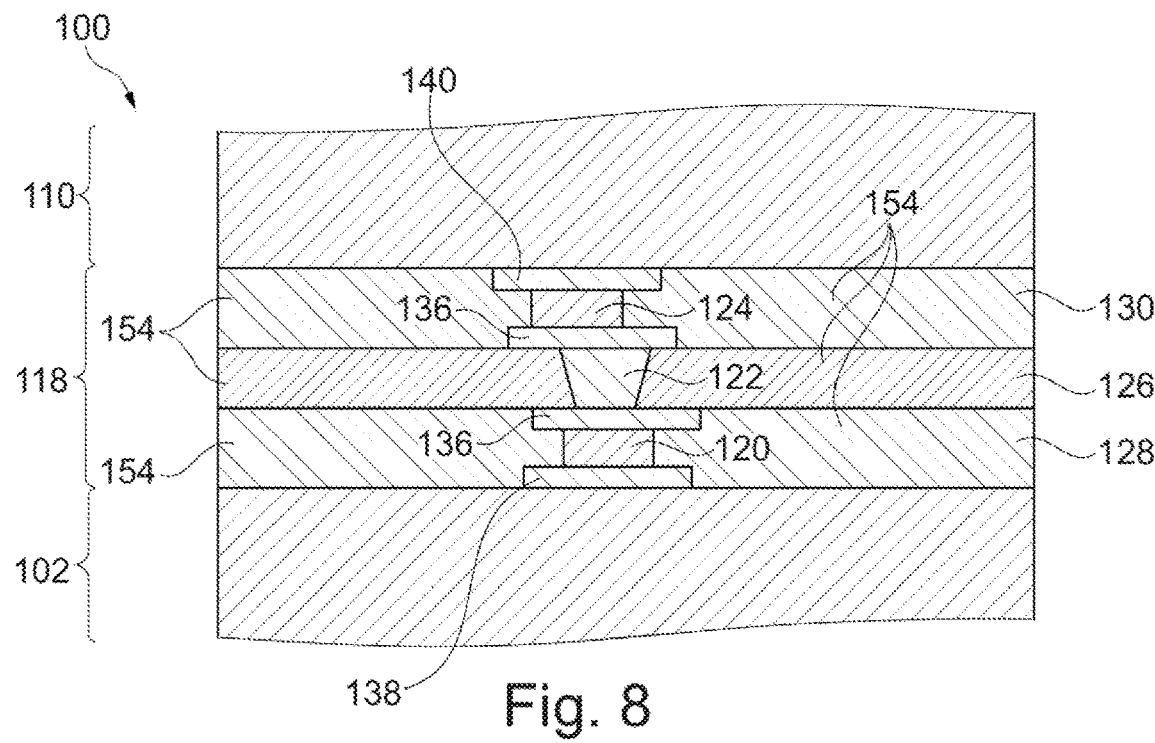
FIG. 8 shows a cross-sectional view of an electronic device according to an exemplary embodiment of the invention obtained by carrying out the method according to FIG. 7.

FIG. 7 shows a cross-sectional view of a structure obtained during carrying out a method of manufacturing an electronic device 100 according to another exemplary embodiment of the invention. FIG. 8 shows a cross-sectional view of an electronic device 100 according to an exemplary embodiment of the invention obtained by carrying out the method according to FIG. 7.

The method described referring to FIG. 7 differs from the method described referring to FIG. 4 in particular in that, according to the embodiment of FIG. 7, a separate (i.e., not yet attached) and recessed (see through hole 166) first connection layer 128 is arranged between the first component carrier 102 (with upwardly protruding vertical interconnect element 120 on connection pad 138) and a central stiffener 126 with central vertical interconnect element 122 and interconnect pads 136, 136. Furthermore, a separate (i.e., not yet attached) and recessed (see through hole 168) second connection layer 130 is arranged between the second component carrier 110 (with downwardly protruding vertical interconnect element 124 on connection pad 140) and the central stiffener 126.

Thereafter, the intermediate structure 118 (in the shown embodiment composed of the three still separate constituents in form of the first connection layer 128, the central stiffener 126, and the second connection layer 130) is connected with the first component carrier 102 on the bottom side, and with the second component carrier 110 on the top side.

Figure 9:
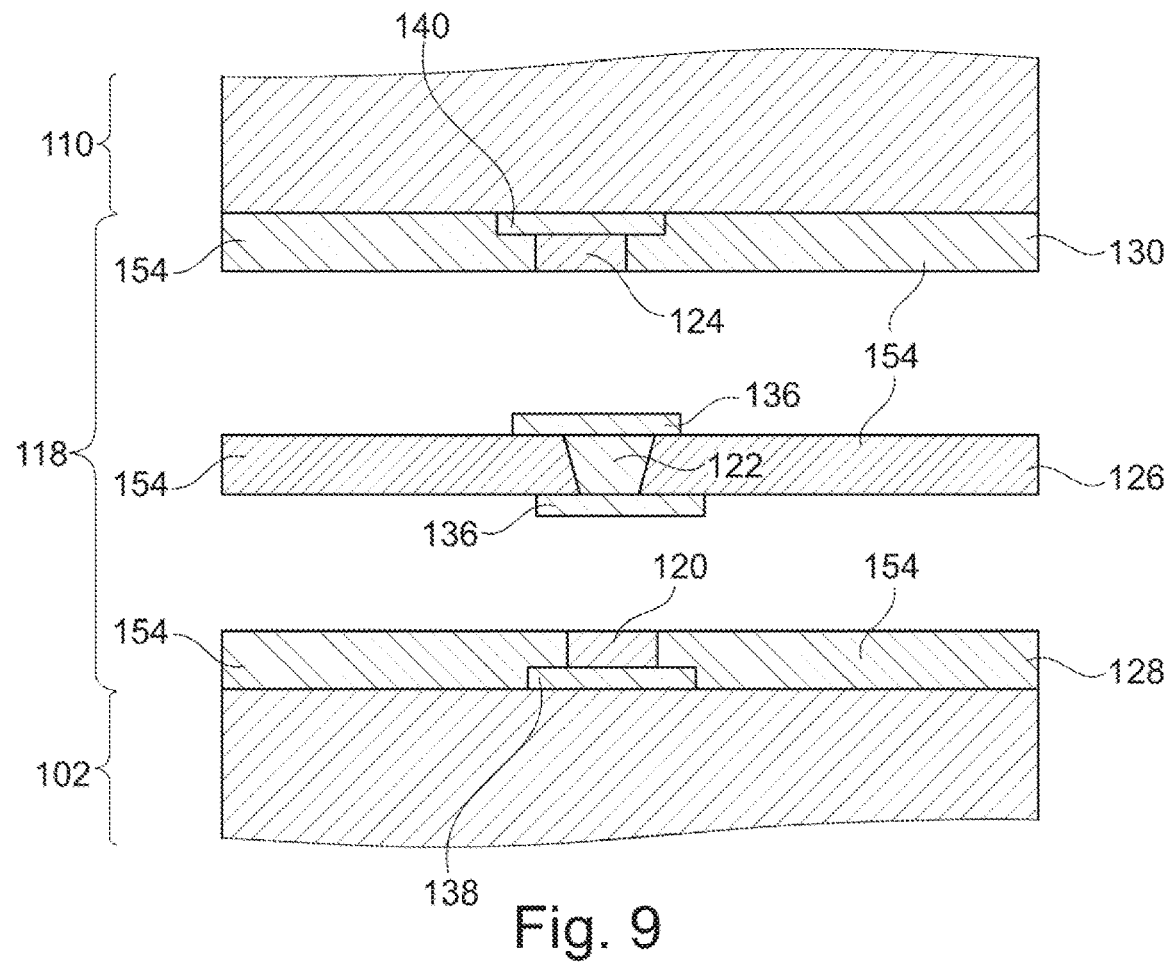
FIG. 9 shows a cross-sectional view of a structure obtained during carrying out a method of manufacturing an electronic device according to still another exemplary embodiment of the invention.
Figure 10:
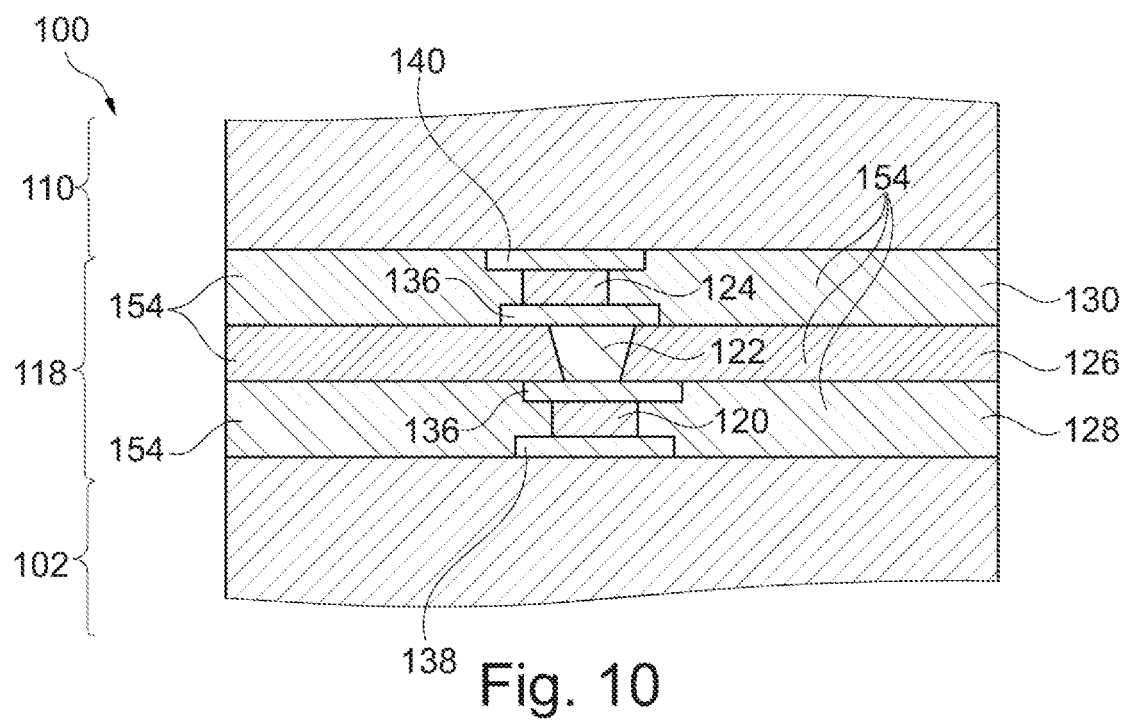
FIG. 10 shows a cross-sectional view of an electronic device according to an exemplary embodiment of the invention obtained by carrying out the method according to FIG. 9.

FIG. 9 shows a cross-sectional view of a structure obtained during carrying out a method of manufacturing an electronic device 100 according to still another exemplary embodiment of the invention. FIG. 10 shows a cross-sectional view of an electronic device 100 according to an exemplary embodiment of the invention obtained by carrying out the method according to FIG. 9.

The method described referring to FIG. 9 differs from the method described referring to FIG. 4 in particular in that, according to the embodiment of FIG. 9, the connection layers 128, 130 are embodied as photoimageable dielectric (PID). Said photoimageable dielectric may be used to plate the copper pillars form the lowermost and uppermost vertical interconnect elements 120, 124 according to FIG. 9 and FIG. 10. Compression bonding may be used to assemble or press.

Figure 11:
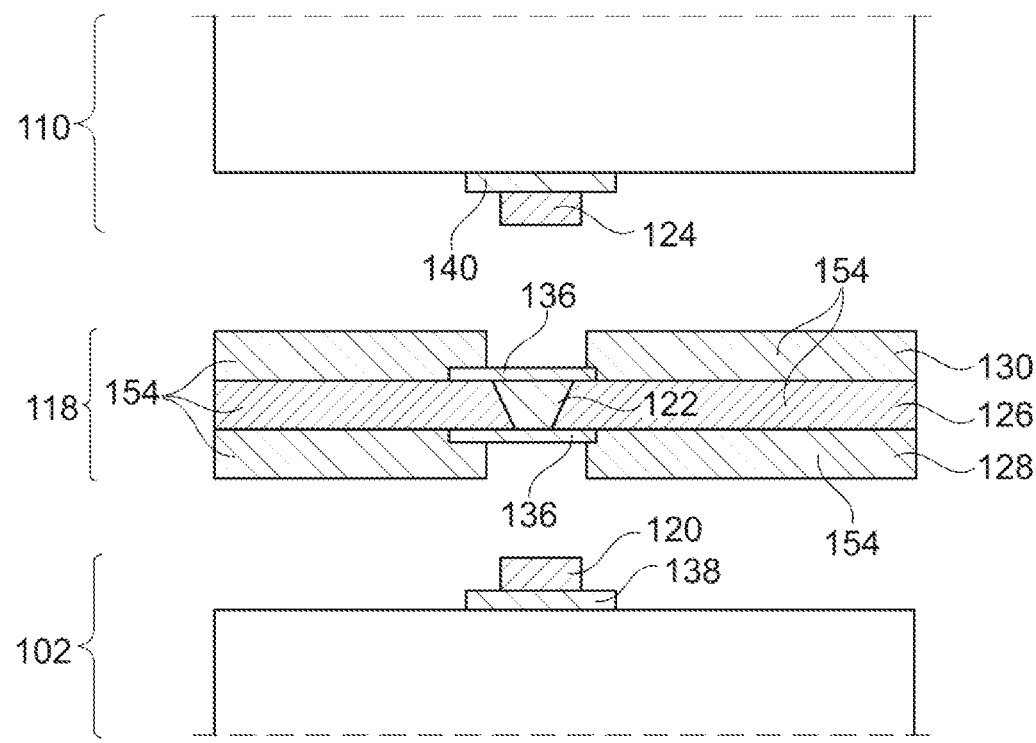
FIG. 11 shows a cross-sectional view of a structure obtained during carrying out a method of manufacturing an electronic device according to still another exemplary embodiment of the invention.

FIG. 11 shows a cross-sectional view of a structure obtained during carrying out a method of manufacturing an electronic device 100 according to yet another exemplary embodiment of the invention.

The method described referring to FIG. 11 differs from the method described referring to FIG. 4 in particular in that, according to the embodiment of FIG. 11, the still uncured connection layers 128, 130 are attached to the central stiffener 126 (rather than to the component carriers 102, 110) prior to the connection of the constituents of the electronic device 100. More specifically, the intermediate structure 118 according to FIG. 11 is formed with central stiffener 126, first connection layer 128 connected on a first main surface of the stiffener 126, and second connection layer 130 connected on a second main surface of the stiffener 126 between the still separate first component carrier 102 and the still separate second component carrier 110. Thereafter, the pre-assembled intermediate structure 118 may be connected with the first component carrier 102 and the second component carrier 110 (not shown).

In the embodiment according to FIG. 11, the prepreg sheets are thus connected to the core rather than to the component carriers 102, 110 prior to the interconnection.

Vertical interconnect elements 120, 124 may be embodied as copper pillars according to FIG. 11. The use of copper pillars instead of electrically conductive paste may offer more reliability and lower electrical resistance. Furthermore, the use of copper pillars and a die bonding process provides more reliable interfaces.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. An electronic device, comprising:
a first component carrier comprising a first stack which comprises at least one first electrically conductive layer structure and/or at least one first electrically insulating layer structure;
a second component carrier comprising a second stack which comprises at least one second electrically conductive layer structure and/or at least one second electrically insulating layer structure; and
an intermediate structure comprising at least three staggered electrically conductive and coupled vertical interconnect elements in an at least partially dielectric sheet and being directly connected between the first component carrier and the second component carrier for electrically coupling the first component carrier with the second component carrier,
wherein the at least partially dielectric sheet of the intermediate structure comprises a central stiffener through which one of the vertical interconnect elements extends, the central stiffener having a locally increased stiffness as compared to surrounding material of the intermediate structure.

2. The electronic device according to claim 1, comprising at least one of the following features:
wherein a central axis of each of the at least three staggered vertical interconnect elements is laterally displaced with respect to the central axis of each of the other vertical interconnect elements;
wherein a central one of the at least three staggered vertical interconnect elements is laterally arranged between an upper one of the at least three staggered vertical interconnect elements and a lower one of the at least three staggered vertical interconnect elements;
wherein an upper one and a lower one of the at least three staggered vertical interconnect elements are laterally displaced by a lateral distance of at least 50 µm;
wherein at least one of the at least three staggered vertical interconnect elements has a diameter in a range from 30 µm to 200 µm;
wherein neighbored ones of the at least three vertical interconnect elements are separated from each other and electrically coupled with each other by a respective horizontally extending interconnect pad.

3. The electronic device according to claim 1,
wherein the at least partially dielectric sheet of the intermediate structure comprises a first connection layer on a first main surface of the stiffener connecting the intermediate structure with the first component carrier and through which one of the vertical interconnect elements extends.

4. The electronic device according to claim 3,
wherein the at least partially dielectric sheet of the intermediate structure comprises a second connection layer on a second main surface of the stiffener connecting the intermediate structure with the second component carrier and through which one of the vertical interconnect elements extends.

5. The electronic device according to claim 1,
wherein the first component carrier comprises, at a main surface of the first component carrier, a first connection pad connected with the vertical interconnect elements, and connected with at least one of the at least one first electrically conductive layer structure;
wherein the second component carrier comprises, at a main surface of the second component carrier, a second connection pad connected with the vertical interconnect elements, and connected with at least one of the at least one second electrically conductive layer structure.

6. The electronic device according to claim 5,
wherein the vertical interconnect elements are arranged to compensate a lateral shift between the first connection pad and the second connection pad.

7. The electronic device according to claim 1, wherein the intermediate structure is free of a redistribution structure.

8. The electronic device according to claim 1, wherein all of the at least three staggered vertical interconnect elements overlap with each other over a common overlapping range in a lateral direction.

9. A method of manufacturing an electronic device, the method comprising:
- providing a first component carrier comprising a first stack which comprises at least one first electrically conductive layer structure and/or at least one first electrically insulating layer structure;
- providing a second component carrier comprising a second stack which comprises at least one second electrically conductive layer structure and/or at least one second electrically insulating layer structure; and
- directly connecting an intermediate structure, comprising at least three staggered electrically conductive and coupled vertical interconnect elements between the first component carrier and the second component carrier for electrically coupling the first component carrier with the second component carrier by the vertical interconnect elements in an at least partially dielectric sheet,
- wherein the at least partially dielectric sheet of the intermediate structure comprises a central stiffener through which one of the vertical interconnect elements extends, the central stiffener having a locally increased stiffness as compared to surrounding material of the intermediate structure.

10. The method according to claim 9, wherein the method comprises:
- connecting at least part of the intermediate structure with at least one of the first component carrier and the second component carrier by at least one of the group consisting of thermal compression bonding, laminating, soldering, brazing, and gluing.

11. The method according to claim 9, wherein the method comprises:
- arranging at least part of the intermediate structure with a central stiffener, a first connection layer connected on a first main surface of the stiffener, and a second connection layer connected on a second main surface of the stiffener between the first component carrier and the second component carrier; and
- thereafter connecting the intermediate structure with the first component carrier and the second component carrier.

12. The method according to claim 9, wherein the method comprises:
- arranging a central stiffener of the intermediate structure between the first component carrier, having a connected first connection layer of the intermediate structure at a main surface, and the second component carrier, having a connected second connection layer of the intermediate structure at a second main surface; and
- thereafter connecting the central stiffener with the first connection layer and with the second connection layer.

13. The method according to claim 9, wherein the method comprises:
- arranging a central stiffener of the intermediate structure between the first component carrier and the second component carrier;
- arranging a separate first connection layer of the intermediate structure between the first component carrier and the central stiffener;
- arranging a separate second connection layer of the intermediate structure between the second component carrier and the central stiffener; and
- thereafter connecting the first component carrier with the first connection layer, the first connection layer with the central stiffener, the central stiffener with the second connection layer, and the second connection layer with the second component carrier.

14. The method according to claim 9, wherein the method comprises, before the connecting:
- storing position and dimension information concerning a connection pad of the first component carrier and a connection pad of the second component carrier, wherein each of the connection pads is to be connected to a respective one of the at least three staggered electrically conductive vertical interconnect elements; and
- using the stored information for forming at least one of the at least three staggered electrically conductive vertical interconnect elements.

15. The component carrier according to claim 1, comprising at least one of the following features:
- wherein at least one of the at least three staggered vertical interconnect elements is a metal-filled via;
- where at least one of the at least three staggered vertical interconnect elements is a metal pillar;
- wherein at least one of the vertical interconnect elements comprises a cured metal paste.

16. The component carrier according to claim 1, comprising at least one of the following features:
- wherein the stiffener has a thickness of less than 200 µm;
- wherein the stiffener comprises glass particles.

17. The component carrier according to claim 3, comprising at least one of the following features:
- wherein at least one of the first connection layer and the second connection layer is a prepreg layer which has a thickness of less than 100 µm;
- wherein at least one of the firs connection layer and the second connection layer is free of glass fibers;
- wherein at least one of the first connection layer and the second connection layer comprises at least one of the group consisting of a pure resin, a resin with reinforcing particles and a photoimageable dielectric.

18. The component carrier according to claim 4, comprising at least one of the following features:
- wherein at least one of the first connection layer and the second connection layer is a prepreg layer which has a thickness of less than 100 µm;
- wherein at least one of the first connection layer and the second connection layer is free of glass fibers;
- wherein at least one of the first connection layer and the second connection layer comprises at least one of the group consisting of a pure resin, a resin with reinforcing particles, and a photoimageable dielectric.

* * * * *